s011178767B2

United States Patent
Nestle et al.

(10) Patent No.: US 11,178,767 B2
(45) Date of Patent: Nov. 16, 2021

(54) CYLINDRICAL CELL WITH CONTACT LUGS

(71) Applicant: VARTA Microbattery GmbH, Ellwangen Jagst (DE)

(72) Inventors: Marc Oliver Nestle, Singapore (SG); Sunil Siddannavar, Karanataka (IN)

(73) Assignee: VARTA Microbattery GmbH, Ellwangen Jagst (DE)

( * ) Notice: Subject to any disclaimer, the term of this patent is extended or adjusted under 35 U.S.C. 154(b) by 105 days.

(21) Appl. No.: 16/675,509

(22) Filed: Nov. 6, 2019

(65) Prior Publication Data

US 2020/0196450 A1 Jun. 18, 2020

(30) Foreign Application Priority Data

Dec. 13, 2018 (EP) ...................................... 18212315

(51) Int. Cl.
*H05K 1/00* (2006.01)
*H05K 1/14* (2006.01)
(Continued)

(52) U.S. Cl.
CPC .......... *H05K 1/145* (2013.01); *H01M 50/109* (2021.01); *H01M 50/543* (2021.01); *H01M 2200/20* (2013.01)

(58) Field of Classification Search
CPC .. H05K 1/145; H01M 50/109; H01M 50/543; H01M 2200/20
See application file for complete search history.

(56) References Cited

U.S. PATENT DOCUMENTS 6,143,440 A 11/2000 Volz et al.
6,376,109 B1 * 4/2002 Sano ................... H01M 50/216
429/1
(Continued)

FOREIGN PATENT DOCUMENTS

DE 10 2013 001 371 7/2014
EP 0 981 173 11/1998
(Continued)

*Primary Examiner* — Pete T Lee
(74) *Attorney, Agent, or Firm* — DLA Piper LLP (US)

(57) ABSTRACT

A cylindrical cell includes a. a cylindrical housing enclosing an interior space and composed of a first and a second metal housing part, wherein the housing includes, at its axial ends, a first planar end face and a second planar end face connected to one another by an annular casing, b. a positive electrode and a negative electrode, at least one of which can intercalate and/or deintercalate lithium ions, wherein the positive electrode electrically connects to the first housing part directly or via a separate electrical conductor, and the negative electrode electrically connects to the second housing part directly or via a separate electrical conductor, c. a first contact lug configured as a sheet-metal part that is welded onto the first end face and which has a planar section extending in a plane parallel to the first end face, and d. a second contact lug configured as a sheet-metal part that is welded onto the second end face and has a planar subsection extending in a plane parallel to the second end face and has a subsection angled away from the plane and extends as far as into the plane of the planar section, wherein the angled-away subsection includes an expansion section in which the second contact lug expands in the main direction of extent in a targeted and predictable manner under a defined tensile loading in its main direction of extent.

12 Claims, 3 Drawing Sheets

(51) Int. Cl.
*H01M 50/109* (2021.01)
*H01M 50/543* (2021.01)

(56) References Cited

U.S. PATENT DOCUMENTS

| | | | | |
|---|---|---|---|---|
| 7,095,625 B2* | 8/2006 | Fukami | ............... | H05K 1/0292 |
| | | | | 361/760 |
| 2003/0186120 A1* | 10/2003 | Wang | ................. | H01M 50/543 |
| | | | | 429/178 |
| 2004/0185338 A1* | 9/2004 | Holl | .................... | H01M 50/183 |
| | | | | 429/174 |
| 2006/0292427 A1* | 12/2006 | Bartling | ............. | H01M 50/183 |
| | | | | 429/406 |
| 2008/0075995 A1* | 3/2008 | Janmey | .............. | H01M 50/183 |
| | | | | 429/122 |
| 2008/0089011 A1 | 4/2008 | Tasei et al. | | |
| 2008/0289171 A1* | 11/2008 | Cheng | ................ | H01M 50/543 |
| | | | | 29/623.1 |
| 2011/0001618 A1 | 1/2011 | Yabushita et al. | | |
| 2012/0015224 A1 | 1/2012 | Pytlik et al. | | |
| 2015/0364728 A1 | 12/2015 | Markert | | |
| 2018/0076467 A1* | 3/2018 | Boolish | ............ | H01M 10/0568 |
| 2020/0083492 A1* | 3/2020 | Koshiol | .................. | H01M 4/08 |
| 2020/0152923 A1* | 5/2020 | Takeuchi | ............... | B23K 26/21 |

FOREIGN PATENT DOCUMENTS

| | | |
|---|---|---|
| WO | 2010/089152 | 8/2010 |
| WO | 2012/048995 | 4/2012 |

* cited by examiner

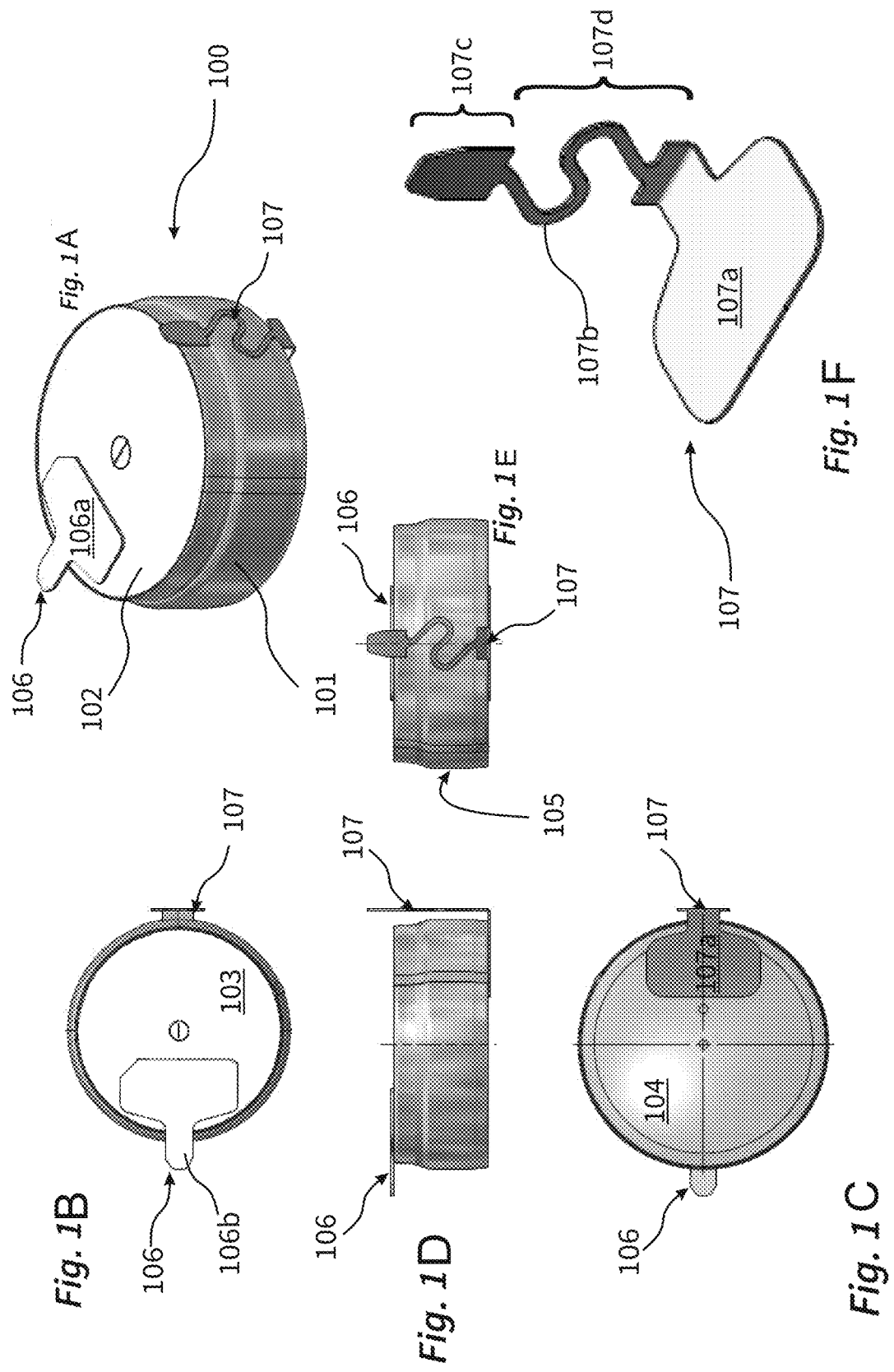

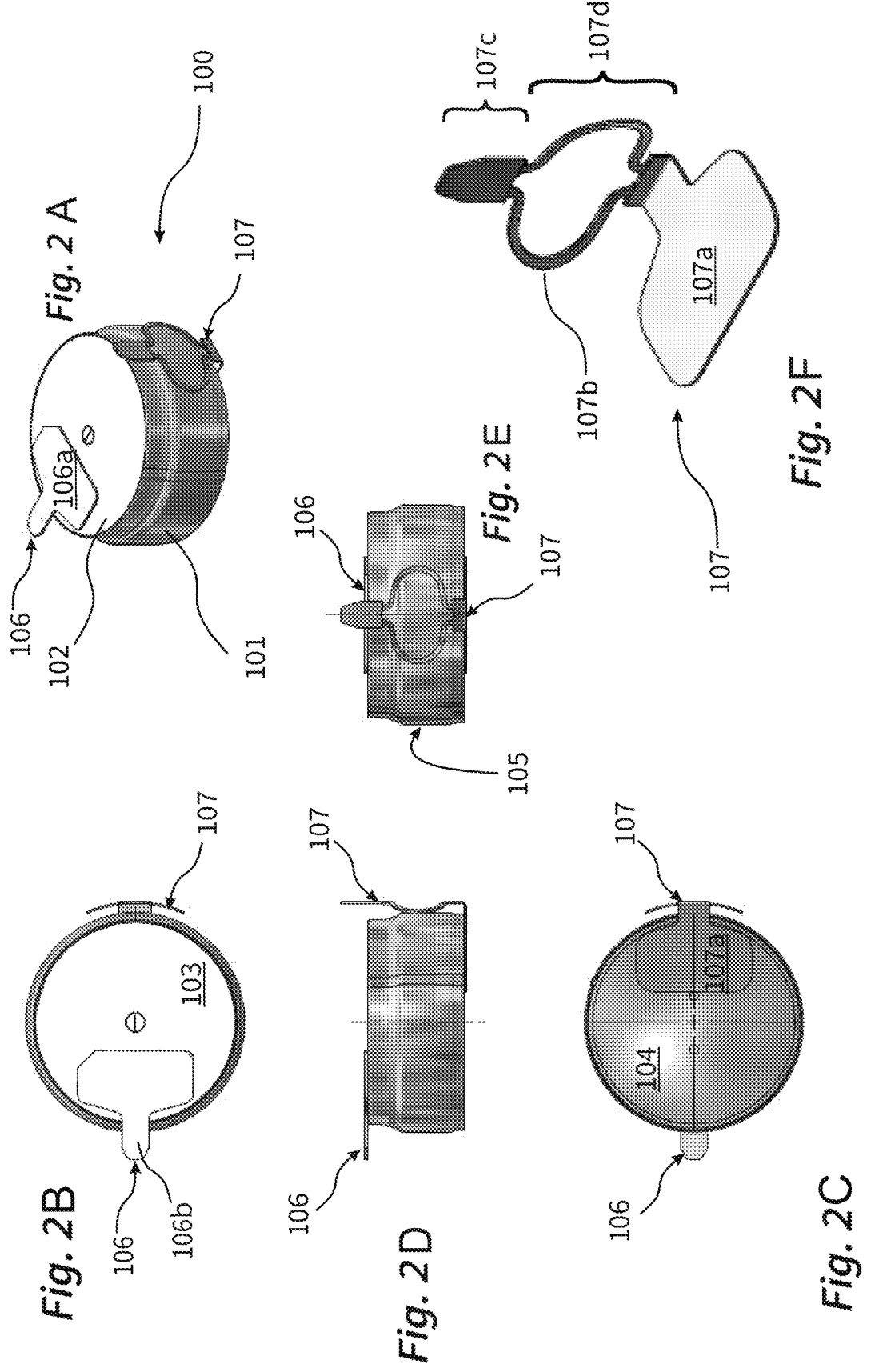

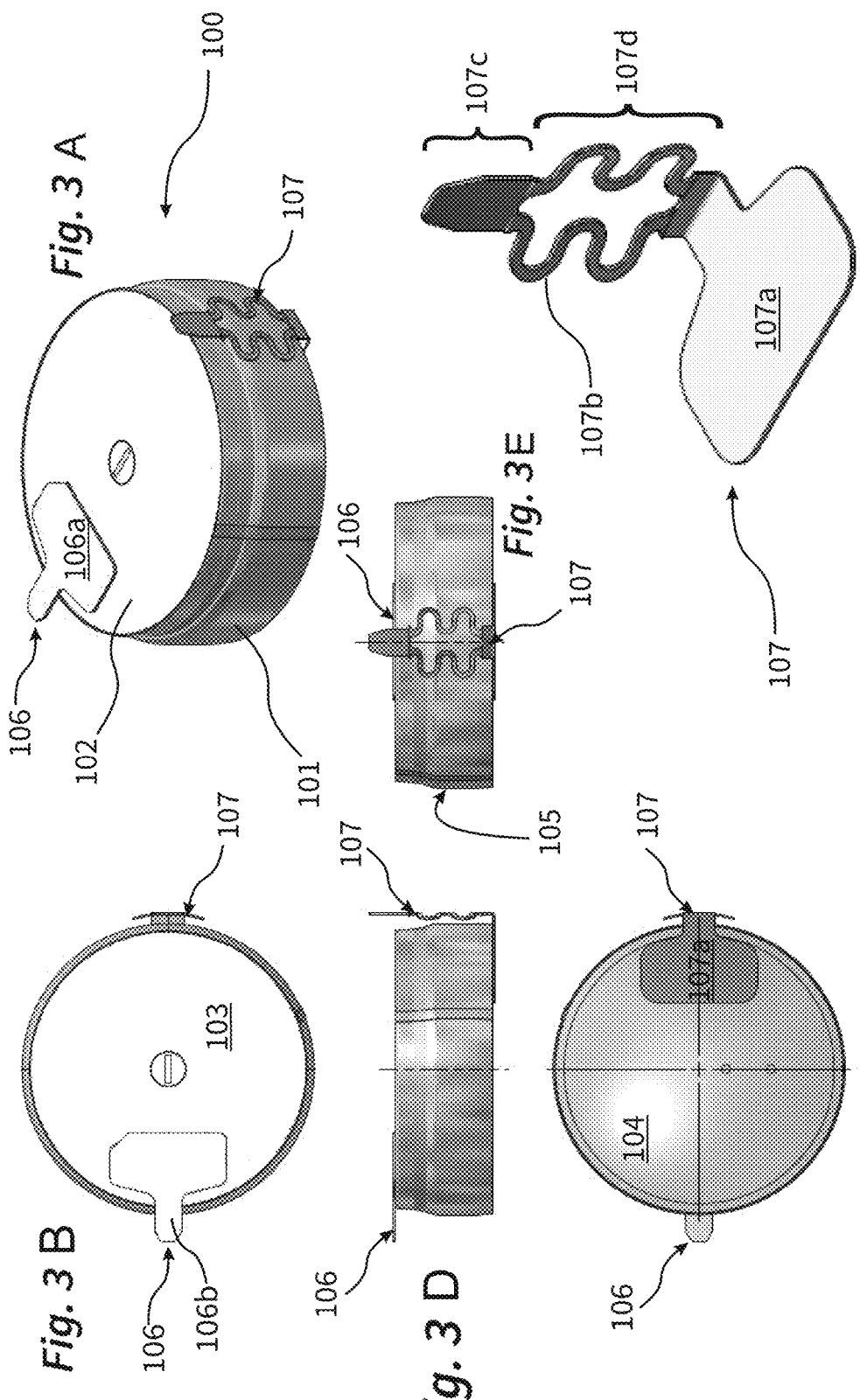

CYLINDRICAL CELL WITH CONTACT LUGS

TECHNICAL FIELD

This disclosure relates to a cylindrical cell with contact lugs.

BACKGROUND

Contact lugs are required to fix cells in electronic devices, for example, onto printed circuit boards, in particular by soldering or welding. The contact lugs first serve as mechanical fastening means, but also as electrical conductors. For this purpose, the cells generally have one contact lug connected to their positive pole and one contact lug connected to their negative pole. Cells with contact lugs of this kind are known, for example, from US 2011/001618 A1.

The cells are often button cells, as presented in US 2011/001618 A1. By definition, button cells are cells with a round, usually cylindrical cross section, the height of which is smaller than its diameter. Button cells are generally axially delimited by two planar, usually round, end faces. For reasons of production, the contact lugs are usually also fitted in these regions. The contact lugs are usually flat sheet-metal strips applied, for example, by resistance welding to the end faces. By bending over one of the contact lugs through 90°, the contact lug can be guided onto the side of the opposite end face. When the contact lugs are located in the same plane, fixing the contact lugs onto a printed circuit board is particularly simple.

In recent years, button cells based on lithium-ion technology have increasingly also been developed, for example, in WO 2010/089152 A1. Button cells of that kind require more safety solutions since, on account of their high energy density and also their easily combustible constituent parts, they can present a great danger to consumers in the event of damage.

A known safety solution for button cells involves creating a rupture cross in one of their end faces. If excess pressure builds up within a cell and excess pressure exceeds a pressure threshold value, the housing of the button cell opens up in a controlled manner in the region of the rupture cross and the excess pressure can escape.

However, a rupture cross may be slightly blocked when a contact lug is welded onto an end face provided with a rupture cross. The rupture process itself may also be impeded, specifically if the end face with the rupture cross comes to rest too close to the surface of the printed circuit board. It has therefore been necessary to either maintain a minimum distance between the end face of the button cell and the printed circuit board, this being at the expense of compactness, or the end face with the rupture cross has had to point away from the printed circuit board.

A considerably more ambitious safety solution is disclosed in WO 2012/048995 A1. The housing of a button cell is designed in the manner of a valve overall. The housing consists of two housing parts that can be axially displaced in relation to one another and can slide apart to a defined extent in the event of excess pressure. In the process, an aperture in the housing casing is exposed, via which aperture the excess pressure can be reduced in a controlled manner.

However, in button cells fixed on a printed circuit board by contact lugs, a minimum distance has had to be kept between an end face of the button cell and the printed circuit board with this safety solution too. Contact lugs welded or soldered to the printed circuit board can otherwise provide mechanical resistance to, possibly even block, housing parts of a cell sliding apart in accordance with WO 2012/048995 A1. Appropriate technical solutions were correspondingly likewise at the expense of compactness.

SUMMARY

We provide a cylindrical cell including a. a cylindrical housing enclosing an interior space and composed of a first and a second metal housing part, wherein the housing includes, at its axial ends, a first planar end face and a second planar end face connected to one another by an annular casing, b. a positive electrode and a negative electrode, at least one of which can intercalate and/or deintercalate lithium ions, wherein the positive electrode electrically connects to the first housing part directly or via a separate electrical conductor, and the negative electrode electrically connects to the second housing part directly or via a separate electrical conductor, c. a first contact lug configured as a sheet-metal part that is welded onto the first end face and has a planar section extending in a plane parallel to the first end face, and d. a second contact lug configured as a sheet-metal part that is welded onto the second end face and has a planar subsection extending in a plane parallel to the second end face and has a subsection angled away from the plane and extends as far as into the plane of the planar section, wherein the angled-away subsection includes an expansion section in which the second contact lug expands in the main direction of extent in a targeted and predictable manner under a defined tensile loading in its main direction of extent.

BRIEF DESCRIPTION OF THE DRAWINGS

FIGS. 1A-1F schematically show a first example of a cell with an S-shaped second contact lug.

FIGS. 2A-2F schematically show a second example of a cell with an O-shaped second contact lug.

FIGS. 3A-3F schematically show a third example of a cell with a wave-like second contact lug.

DETAILED DESCRIPTION

Our cells are of cylindrical design and generally have the following a. to f.:
  a. The cell comprises a cylindrical housing that encloses an interior space and is composed of a first and a second metal housing part.
  b. The housing comprises, at its axial ends, a first planar end face and a second planar end face connected to one another by an annular casing.
  c. The cell comprises a positive electrode and a negative electrode, at least one of which can intercalate and/or deintercalate lithium ions.
  d. The positive electrode electrically connects to the first housing part directly or via a separate electrical conductor, and the negative electrode electrically connects to the second housing part directly or via a separate electrical conductor.
  e. The cell comprises a first contact lug configured as a sheet-metal part that is welded onto the first or onto the second end face and has a planar section extending in a plane parallel to the first end face or to the second end face.
  f. The cell comprises a second contact lug configured as a sheet-metal part that is welded onto the end face not provided with the first contact lug and has a planar subsection extending in a plane parallel to the end face and has a subsection angled away from the plane and extends as far as into the plane of the planar section.

The first contact lug is preferably welded onto the first end face. The second contact lug is preferably welded onto the first end face. As a result, the cell therefore preferably comprises a first contact lug configured as a sheet-metal part that is welded onto the first end face and has a planar section extending in a plane parallel to the first end face, and comprises a second contact lug configured as a sheet-metal part that is welded onto the second end face and has a planar subsection extending in a plane parallel to the second end face and has a subsection angled away from the plane and extends as far as into the plane of the planar section.

The cell is preferably designed in the form of a straight circular cylinder. The planar end faces are therefore preferably of circular design and oriented parallel to one another. The axis of the cylinder, which is oriented perpendicularly to the end faces, preferably runs through the center of the end faces.

The housing parts are preferably of cup-like design. In addition to preferably round bases, they each preferably have a hollow-cylindrical casing. The outer faces of the bases preferably form the end faces.

An annular seal composed of plastic and electrically insulates the housing parts from one another is usually arranged between the two metal housing parts. Furthermore, the seal ensures liquid-tight closure of the cells.

The housing parts can be composed of nickel-plated steel or sheet metal, for example. Furthermore, trimetal, for example, with the sequence nickel, steel (or stainless steel) and copper, is also a suitable metal material. It is also possible for one housing part to be formed from aluminium or an aluminium alloy, while the other housing part consists of steel or trimetal.

The electrodes of the cell are preferably of strip-like design and are a constituent part of a winding composite body arranged in the interior space of the housing. The winding composite body is preferably formed from at least two electrode strips (the positive and the negative electrode) helically wound around a winding axis and at least one separator strip helically wound around the winding axis. The winding composite body is preferably likewise of cylindrical design and accordingly preferably likewise has two circular end faces.

The end faces of the winding composite body are preferably formed by the longitudinal edges of the at least one separator strip and point in the direction of the round housing bases parallel to one another so that the winding axis is oriented perpendicularly or at least substantially perpendicularly to the housing bases. The winding axis and the cylinder axis preferably coincide.

Examples of winding composite bodies of this kind are described, for example, in WO 2010/089152 A1, the subject matter of which is incorporated herein by reference.

The end faces of the winding composite body preferably bear against the inner faces of the preferably round bases.

Both the positive electrode and also the negative electrode preferably comprise a strip-like metal current collector covered by electrode material. The current collectors electrically contact-connect the electrode material over as large a surface area as possible. They usually consist of strip-like, sheet-like metal substrates, for example, metal foils or a metal foam or a metallized nonwoven.

To electrically contact-connect the electrodes to the housing parts, the current collectors can be directly welded to the housing parts, preferably to the inner faces of the bases of the housing parts. As an alternative, the current collectors can also be welded to the separate electrical conductor which, for its part, electrically connects to the housing parts.

All materials that can take up lithium ions and release them again are suitable electrode materials for the electrodes of the cell. Materials in this respect for the negative electrode of secondary lithium-ion systems include, in particular, materials based on carbon such as graphitic carbon or non-graphitic carbon materials capable of intercalating lithium. Lithium-metal oxide compounds and lithium-metal phosphate compounds such as $LiCoO_2$ and $LiFePO_4$, for instance are suitable for the positive electrode of secondary lithium-ion systems.

Furthermore, the electrodes can contain electrode binders and conductors. The electrode binders ensure the mechanical stability of the electrodes and provide for contact-connection of the particles composed of electrochemically active material to one another and also to the current collector. Conductors such as carbon black increase the electrical conductivity of the electrodes.

The contact lugs of the cell are, like the contact lugs of known cells, required to fix and to electrically connect the cell.

The cells are distinguished by the specially configured second contact lug. The cell specifically additionally has the following feature g.:

g. The angled-away subsection comprises an expansion section in which the second contact lug is designed to expand in the main direction of extent in a targeted and predictable manner under a defined tensile loading in its main direction of extent.

Under the tensile loading, the angled-away subsection experiences an expansion in length, the second contact lug is extended, specifically preferably without a change in the cross section of the second contact lug in the expansion section in the process. A tensile loading of this kind can be caused, for example, by housing parts of a cell sliding apart as described at the outset in accordance with WO 2012/048995 A1. Blocking of this mechanism can be precluded by the configuration according to the invention of the second contact lug.

For clarification, the main direction of extent of the contact lug is understood to be the direction in which the contact lug has its greatest extent in the state in which it is laid out flat, that is to say before the angled-away subsection is angled away. When the angled-away subsection is at an angle of 90° to the plane of the planar subsection of the second contact lug, the main direction of extent in the expansion section is exactly parallel to the axis of the cylindrical cell.

It is possible for the angled-away subsection to not only comprise the expansion section, but rather itself be designed as the expansion section. However, the angled-away subsection particularly preferably comprises a terminal contact section and the expansion section between the contact section and the plane of the planar subsection.

Particularly preferably, the cell is additionally distinguished by at least one of the immediately following a. to d.:

a. The second contact lug is designed as a track- or strip-like conductor or as a conductor with a round cross section in the expansion section or comprises at least one conductor of this kind in the expansion section.

b. The second contact lug has, in the main direction of extent, a cross section which is tapered in relation to the terminal contact section and/or the subsection in the expansion section.

c. The second contact lug or the at least one track- or strip-like conductor or conductor with a round cross section has a non-linear, in particular a bent, profile in the expansion section.
d. The length of the second contact lug in the expansion section and/or the length of the at least one track- or strip-like conductor or conductor with a round cross section exceeds the height of the cell at least by the factor 1.1, preferably by the factor 1.3.

With preference, at least the features a. and c immediately above, preferably even the features a., c. and d. immediately above, particularly preferably the features a. to d. immediately above, are implemented in combination with one another.

When the contact lug in the expansion section is designed as a track- or strip-like conductor or comprises a conductor of this kind, this conductor preferably has a width of 0.5 mm to 4 mm. The width of the track- or strip-like conductor in the expansion section is preferably constant.

Due to the tapering, the contact lug in the expansion section can also have the function of a fuse. If an excessively high current flows through a correspondingly tapered contact lug, the contact lug can be destroyed by melting. However, in structures such as this, the contact lug is at least discolored in the region of the tapering, which discoloration can serve as an indicator of a short circuit.

A non-linear profile of the second contact lug in the expansion section means that the contact lug is subject to at least one change in direction, preferably two or more changes in direction, in this section.

The height of the cell generally means the distance between the first and the second end face of the housing. The length of the second contact lug and/or the length of the at least one track- or strip-like conductor or conductor with a round cross section in the expansion section particularly preferably exceeds the height of the cell at least by a factor of 1.1 to 5, in particular 1.3 to 5.

Further particularly preferably, the cell is additionally distinguished by at least one of the immediately following a. to c.:
  a. The contact lug comprises at least one bent or bent-away lower section in the expansion section.
  b. The contact lug is of S-, U- or Z-shaped design in the expansion section or comprises a lower section designed in this way within the expansion section.
  c. The contact lug is of wave-like design in the expansion section or comprises a lower section designed in this way within the expansion section.

With preference, at least the features a. and b immediately above, preferably even the features a. to c. immediately above, are implemented in combination with one another. In all these instances, the second contact lug is particularly preferably designed as a track-like or strip-like conductor or as a conductor with a round cross section in the expansion section and has a length in the expansion section that exceeds the height of the cell at least by the factor 1.1.

If the contact lug is of wave-like design in the expansion section or comprises a lower section of wave-like design, the wave shape is preferably a sinusoidal, sawtooth, triangular or square wave.

Further particularly preferably, the cell is additionally distinguished by at least one of the immediately following a. to d.:
  a. The expansion section comprises two conductor tracks or two strip-like conductors or two conductors with a round cross section.
  b. The two conductor tracks or the two strip-like conductors or the two conductors with a round cross section each have a bent profile in the expansion section.
  c. The two conductor tracks or the two strip-like conductors or the two conductors with a round cross section are bent in opposite bending directions in the expansion section.
  d. The second contact lug is of O-shaped design in the expansion section or comprises a lower section designed in this way within the expansion section.

With preference, at least the features a. and b immediately above, preferably even the features a. to c. immediately above, particularly preferably even the features a. to d. immediately above, are implemented in combination with one another.

Further particularly preferably, the cell is additionally distinguished by at least one of the immediately following a. and b.:
  a. The first contact lug comprises a contact section that can be angled away or is angled away from the plane of the planar section.
  b. The contact section of the first contact lug points in the same direction as the contact section of the second contact lug.

With preference, the features a. and b immediately above are implemented in combination with one another.

Further particularly preferably, the cell is additionally distinguished by at least one of the immediately following a. to c.:
  a. The cell has a diameter of 5 mm to 50 mm, preferably 5 mm to 25 mm.
  b. The cell has a height of 3 mm to 50 mm.
  c. The cell is a button cell.

With preference, at least the features a. and b immediately above, preferably even the features a. to c. immediately above, are implemented in combination with one another.

Further particularly preferably, the cell is additionally distinguished by at least one of the immediately following a. and b.:
  a. The contact lugs consist of sheet metal with a thickness of 0.25 mm to 2.5 mm.
  b. The contact lugs are manufactured as stamped parts.

With preference, the features a. and b immediately above are implemented in combination with one another.

Further particularly preferably, the cell is additionally distinguished by at least one of the immediately following a. and b.:
  a. The cell has a rupture cross.
  b. The rupture cross is made in the first end face or in the second end face.

With preference, the features a. and b immediately above are implemented in combination with one another.

Further particularly preferably, the cell is additionally distinguished by at least one of the immediately following a. and b.:
  a. The housing consists of two housing parts which can be displaced axially in relation to one another.
  b. The housing has, in the casing, a hole which can serve to vent the interior space.

With preference, the features a. and b immediately above are implemented in combination with one another.

Further particularly preferably, the cell is additionally distinguished by the immediately following a.:
  a. The cell is fixed on a printed circuit board via the contact sections.

Further features, details and advantages can be found in the appended claims and the abstract, the wording of both of which is incorporated in the content of the description by reference, the following description of preferred examples and also on the basis of the drawings.

The cell 100 illustrated in FIGS. 1A-1F has a cylindrical housing composed of the housing parts 101 and 102. The cell 100 is a button cell. The first housing 101 forms the positive pole of the cell 100, and the second housing part 102 forms the negative pole. At its axial ends, the housing comprises the planar first end face 103 and the planar second end face 104. The end faces are connected to one another via the annular casing 105.

The cell 100 is a lithium-ion cell. An electrode separator winding (not illustrated), similar to those described in WO 2010/089152 A1, is arranged in the housing.

The cell 100 comprises the first contact lug 106 configured as a sheet-metal part and welded onto the first end face 103. The contact lug 106 has the planar section 106a extending in a plane parallel to the first end face 103, and also the contact section 106b, which can be angled away out of the plane of the section 106a.

Furthermore, the cell 100 comprises the second contact lug 107 configured as a sheet-metal part and welded onto the second end face 104. The contact lug 107 comprises the planar subsection 107a extending in a plane parallel to the second end face 104, and the subsection 107b, which is angled away from the plane and extends as far as into the plane of the planar section 106a. This angled-away subsection 107b comprises the terminal contact section 107c and the expansion section 107d between the contact section 107c and the plane of the planar subsection 107a. The second contact lug 107 can expand out of this section under tensile loading in its main direction of extent.

The second contact lug 107 is of S-shaped design, in particular designed as a track-like conductor in an S-shape or as a strip-like conductor in an S-shape or as a conductor with a round cross section in an S-shape, in the expansion section 107d, that is to say has a non-linear profile in the expansion section 107d. The total length of the conductor of S-shaped design significantly exceeds the height of the cell.

FIGS. 1A-1F comprise a plurality of separate illustrations of the cell 100. The cell is depicted in a plan view obliquely from the front in illustration A, vertically from the top in illustration B, vertically from below in illustration C and from the side in illustrations D and E.

Illustration F shows the second contact lug 107 before it was welded to the cell 100. The planar subsection 107a is illustrated in a light color and the angled-away subsection 107b, which is subdivided into the contact section 107c and the expansion section 107d, is illustrated in a dark color.

FIGS. 2A-2F also comprise a plurality of separate illustrations of the cell 100. As in FIGS. 1A-1F, the cell is depicted in a plan view obliquely from the front in illustration A, vertically from the top in illustration B, vertically from below in illustration C and from the side in illustrations D and E.

Illustration F shows the second contact lug 107 before it was welded to the cell 100. The planar subsection 107a is illustrated in a light color and the angled-away subsection 107b, which is subdivided into the contact section 107c and the expansion section 107d, is illustrated in a dark color.

The example of the cell 100 illustrated in FIGS. 2A-2F differs from that illustrated in FIGS. 1A-1F only in respect of the configuration of the second contact lug. The contact lug is not of S-shaped design, but rather of O-shaped design.

FIGS. 3A-3F also comprise several separate illustrations of the cell 100. As in FIGS. 1A-1F and 2A-2F, the cell is depicted in a plan view obliquely from the front in illustration A, vertically from the top in illustration B, vertically from below in illustration C and from the side in illustrations D and E.

Illustration F shows the second contact lug 107 before it was welded to the cell 100. The planar subsection 107a is illustrated in a light color and the angled-away subsection 107b, which is subdivided into the contact section 107c and the expansion section 107d, is illustrated in a dark color.

The example of the cell 100 illustrated in FIGS. 3A-3F differs from that illustrated in FIGS. 1A-1F only in respect of the configuration of the second contact lug. The contact lug is not of S-shaped design, but rather of wave-like design.

What is claimed is:

1. A cylindrical cell comprising:
   a. a cylindrical housing enclosing an interior space and composed of a first and a second metal housing part, wherein the housing comprises, at its axial ends, a first planar end face and a second planar end face connected to one another by an annular casing,
   b. a positive electrode and a negative electrode, at least one of which can intercalate and/or deintercalate lithium ions, wherein the positive electrode electrically connects to the first housing part directly or via a separate electrical conductor, and the negative electrode electrically connects to the second housing part directly or via a separate electrical conductor,
   c. a first contact lug configured as a sheet-metal part that is welded onto the first end face and which has a planar section extending in a plane parallel to the first end face, and
   d. a second contact lug configured as a sheet-metal part that is welded onto the second end face and has a planar subsection extending in a plane parallel to the second end face and has a subsection angled away from the plane and extends as far as into the plane of the planar section, wherein the angled-away subsection comprises an expansion section in which the second contact lug expands in the main direction of extent in a targeted and predictable manner under a defined tensile loading in its main direction of extent,
   wherein a length of the second contact lug in the expansion section and/or length of the at least one track or strip conductor or conductor with a round cross section exceeds the height of the cell at least by a factor of 1.1.

2. The cell according to claim 1, wherein the angled-away subsection comprises a terminal contact section and the expansion section between the contact section and the plane of the planar subsection.

3. The cell according to claim 1, wherein at least one of:
   the second contact lug is a track or strip conductor or conductor with a round cross section in the expansion section or comprises at least one conductor in the expansion section,
   the second contact lug has, in a main direction of extent, a cross section tapered in relation to the terminal contact section of the angled-away subsection and/or the planar subsection in the expansion section, and
   the second contact lug or the at least one track or strip conductor or conductor with a round cross section has a non-linear, or bent profile in the expansion section.

4. The cell according to claim 1, wherein at least one of:
   the contact lug comprises at least one bent or bent-away lower section in the expansion section,
   the contact lug is of S-, U- or Z-shaped design in the expansion section or comprises a lower section designed in this way within the expansion section, and the contact lug is a wave design in the expansion section or comprises a lower section designed in this way within the expansion section.

5. The cell according to claim 1, wherein at least one of:
the expansion section comprises two conductor tracks or two strip conductors or two conductors with a round cross section,
the two conductor tracks or the two strip conductors or the two conductors with a round cross section each have a bent profile in the expansion section,
the two conductor tracks or the two strip conductors or the two conductors with a round cross section are bent in opposite bending directions in the expansion section, and
the second contact lug is an O-shape in the expansion section or comprises a lower section designed in this way within the expansion section.

6. The cell according to claim 1, wherein at least one of:
the first contact lug comprises a contact section that can be angled away or is angled away from the plane of the section, and
the contact section of the first contact lug points in the same direction as the contact section of the second contact lug.

7. The cell according to claim 1, wherein at least one of:
the cell has a diameter of 5 mm to 25 mm,
the cell has a height of 3 mm to 50 mm, and
the cell is a button cell.

8. The cell according to claim 1, wherein at least one of:
the contact lugs and consist of sheet metal with a thickness of 0.25 mm to 2.5 mm, and
the contact lugs and are manufactured as stamped parts.

9. The cell according to claim 1, wherein at least one of:
the cell has a rupture cross, and
the rupture cross is made in the first end face or in the second end face.

10. The cell according to claim 1, wherein at least one of:
the housing consists of two housing parts that can be displaced axially in relation to one another, and
the housing has, in the casing, a hole that can vent the interior space.

11. The cell according to claim 1, wherein the cell is fixed on a printed circuit board via the contact sections.

12. A cylindrical cell comprising:
a. a cylindrical housing enclosing an interior space and composed of a first and a second metal housing part, wherein the housing comprises, at its axial ends, a first planar end face and a second planar end face connected to one another by an annular casing,
b. a positive electrode and a negative electrode, at least one of which can intercalate and/or deintercalate lithium ions, wherein the positive electrode electrically connects to the first housing part directly or via a separate electrical conductor, and the negative electrode electrically connects to the second housing part directly or via a separate electrical conductor,
c. a first contact lug configured as a sheet-metal part that is welded onto the first end face and which has a planar section extending in a plane parallel to the first end face, and
d. a second contact lug configured as a sheet-metal part that is welded onto the second end face and has a planar subsection extending in a plane parallel to the second end face and has a subsection angled away from the plane and extends as far as into the plane of the planar section, wherein the angled-away subsection comprises an expansion section in which the second contact lug expands in the main direction of extent in a targeted and predictable manner under a defined tensile loading in its main direction of extent,
wherein the contact lug is of S-, U- or Z-shaped design in the expansion section or comprises a lower section designed in this way within the expansion section.

* * * * *